(12) United States Patent
Hsiao et al.

(10) Patent No.: US 12,557,655 B2
(45) Date of Patent: Feb. 17, 2026

(54) PASSIVE DEVICE STRUCTURE STRESS REDUCTION

(71) Applicant: Taiwan Semiconductor Manufacturing Company, Ltd., Hsinchu (TW)

(72) Inventors: Yuan-Yang Hsiao, Hsinchu (TW); Tsung-Chieh Hsiao, Changhua County (TW); Wen-Chiung Tu, Hsinchu (TW); Ying-Yao Lai, Hsinchu (TW); Chen-Te Chu, Hsinchu (TW); Mao-Nan Wang, Hsinchu (TW); Chen-Chiu Huang, Hsinchu (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 928 days.

(21) Appl. No.: 17/711,740

(22) Filed: Apr. 1, 2022

(65) Prior Publication Data

US 2023/0317631 A1 Oct. 5, 2023

(51) Int. Cl.
  *H01L 23/00* (2006.01)
  *H01L 23/522* (2006.01)
  *H10D 1/68* (2025.01)

(52) U.S. Cl.
  CPC ........ *H01L 23/562* (2013.01); *H01L 23/5223* (2013.01); *H01L 23/5226* (2013.01); *H10D 1/692* (2025.01)

(58) Field of Classification Search
  CPC ............... H01L 23/562; H01L 23/5223; H01L 23/5226; H01L 21/76805; H10D 1/692
  See application file for complete search history.

(56) References Cited

U.S. PATENT DOCUMENTS

| | | | |
|---|---|---|---|
| 11,114,373 B1 | 9/2021 | Hsiao et al. | |
| 11,145,564 B2 | 10/2021 | Huang et al. | |
| 11,145,592 B2 | 10/2021 | Shen et al. | |
| 2012/0295186 A1* | 11/2012 | Hsieh | G03F 7/203 |
| | | | 430/312 |

(Continued)

FOREIGN PATENT DOCUMENTS

| | | |
|---|---|---|
| JP | 2013021187 A | 1/2013 |
| TW | 202008601 A | 2/2020 |
| TW | 202143428 A | 11/2021 |

*Primary Examiner* — Mohammad A Rahman
(74) *Attorney, Agent, or Firm* — HAYNES AND BOONE, LLP

(57) ABSTRACT

Methods for forming a back-end-of-line (BEOL) passive device structure are provided. A method according to the present disclosure includes depositing a first conductor layer over a substrate, patterning the first conductor layer to form a patterned first conductor layer, depositing a first insulation layer over the patterned first conductor layer, depositing a second conductor layer over the first insulation layer, patterning the second conductor layer to form a patterned second conductor layer, depositing a second insulation layer over the patterned second conductor layer, depositing a third conductor layer over the second insulation layer, and patterning the third conductor layer to form a patterned third conductor layer. The patterning of the first conductor layer includes removing a right-angle edge of the first conductor layer.

20 Claims, 17 Drawing Sheets

(56) References Cited

U.S. PATENT DOCUMENTS

| | | | | |
|---|---|---|---|---|
| 2014/0104745 | A1* | 4/2014 | Zheng | H01G 4/012 |
| | | | | 361/275.1 |
| 2018/0182836 | A1* | 6/2018 | Beak | H10K 59/123 |
| 2021/0225894 | A1* | 7/2021 | Cao | H10D 86/443 |
| 2021/0376058 | A1* | 12/2021 | Shen | H10B 12/03 |
| 2023/0115443 | A1* | 4/2023 | Kim | H10B 12/30 |
| | | | | 257/295 |

* cited by examiner

PASSIVE DEVICE STRUCTURE STRESS REDUCTION

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

As the geometry size of IC devices decreases, passive devices that require large surface areas are moved to back-end-of-line (BEOL) structures. Metal-Insulator-Metal (MIM) capacitors are among examples of such passive devices. A typical MIM capacitor includes multiple conductor plate layers that are insulated from one another by multiple insulator layers. Conductor plate layers in an MIM may have different geometrical shapes. Stress concentrations or stress accumulations may occur as a result of irregularities in the geometry that cause an interruption of the stress flow. Such stress accumulations may result in cracks, delamination, or other failures. Therefore, although existing MIM structures and the fabrication process thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
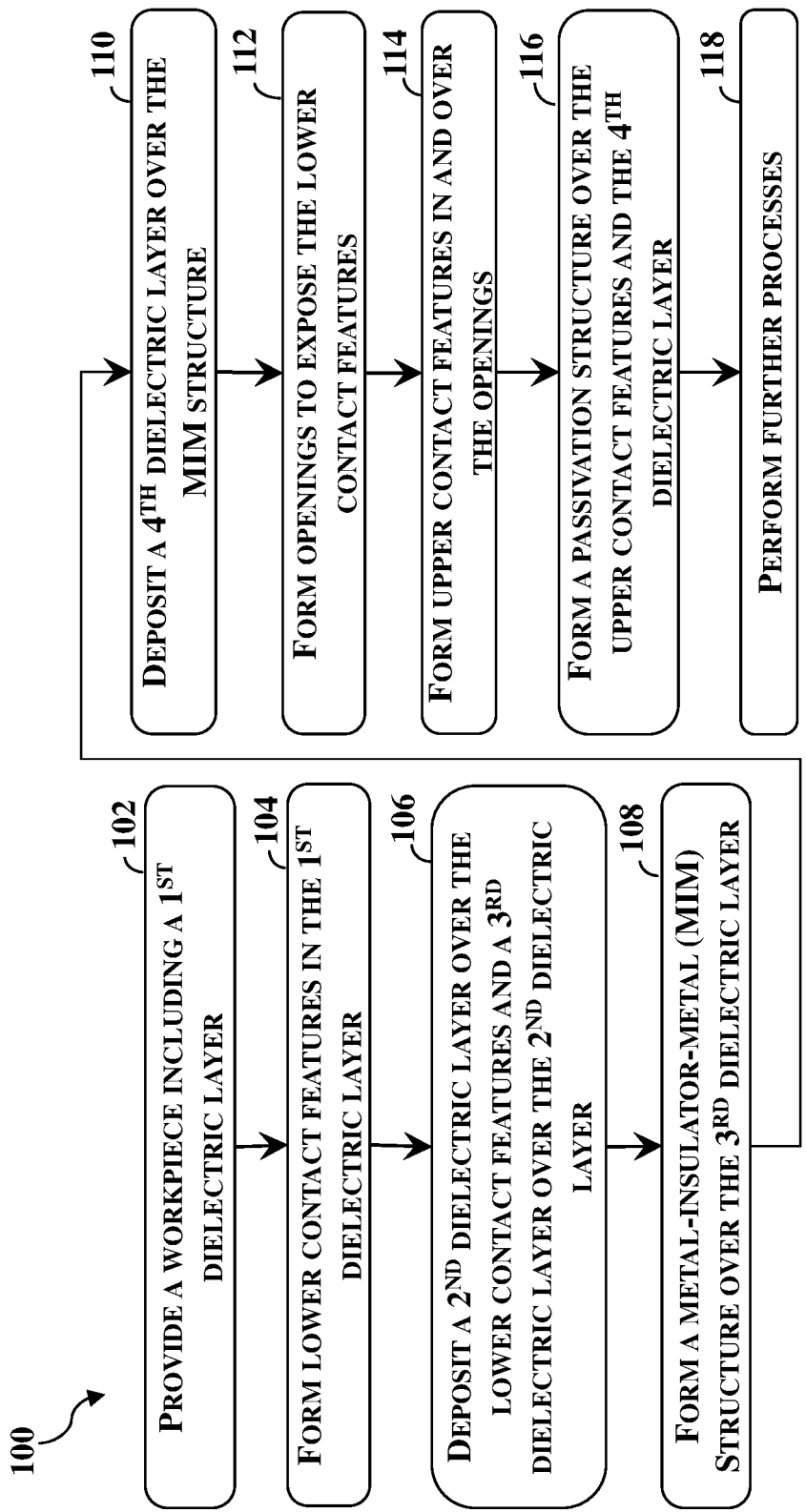
FIG. 1 is a flow chart of a method for fabricating a device structure, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Metal-Insulator-Metal (MIM) capacitors have been widely used in functional circuits such as mixed signal circuits, analog circuits, Radio Frequency (RF) circuits, Dynamic Random Access Memories (DRAMs), embedded DRAMs, and logic operation circuits. In system-on-chip (SOC) applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. As its name suggests, an MIM capacitor includes a sandwich structure of interleaving metal layers and insulator layers. An example MIM capacitor includes multiple conductor plate layers, each of which is insulated from an adjacent conductor plate layer by an insulator layer. More than one contact via is physically and electrically coupled to one or more of the conductor plate layers. It is observed that stress exerted on the conductor plate layers by the contact vias may accumulate or be concentrated near or around right or acute angles of the conductor plate layers. The stress concentration may increase the possibility of cracks or delamination, ultimately leading to increased defect density.

The present disclosure provides a method to prevent or reduce stress concentration around an MIM structure. The method of the present disclosure receives a design of an MIM structure that includes a plurality of conductor plate layers. Each of the plurality of conductor plate layers includes right corners. The method of the present disclosure includes steps to modify the mask design by eliminating both exterior right angles and interior right angles such that the patterned conductor plate layers include obtuse-angle corners. The elimination of the right-angle corners of the conductor plate layers reduce stress concentration and defect density.

The various aspects of the present disclosure will now be described in more detail with reference to the figures. In that regard, FIG. 1 is a flowchart illustrating a method 100 for fabricating a device structure, according to embodiments of the present disclosure. Method 100 is merely an example and is not intended to limit the present disclosure to what is explicitly illustrated in method 100. Additional steps can be provided before, during, and after method 100, and some steps described can be replaced, eliminated, or moved around for additional embodiments of the method. Not all steps are described herein in detail for reasons of simplicity. Method 100 is described below in conjunction with FIGS. 2-14, which are fragmentary cross-sectional views of a workpiece at different stages of fabrication according to embodiments of method 100. Because the workpiece 200 will be fabricated into a device structure at the conclusion of the fabrication processes, the workpiece 200 may also be referred to as a device structure 200 as the context requires. Additionally, throughout the present application, like reference numerals denote like features, unless otherwise excepted.

Figure 2:
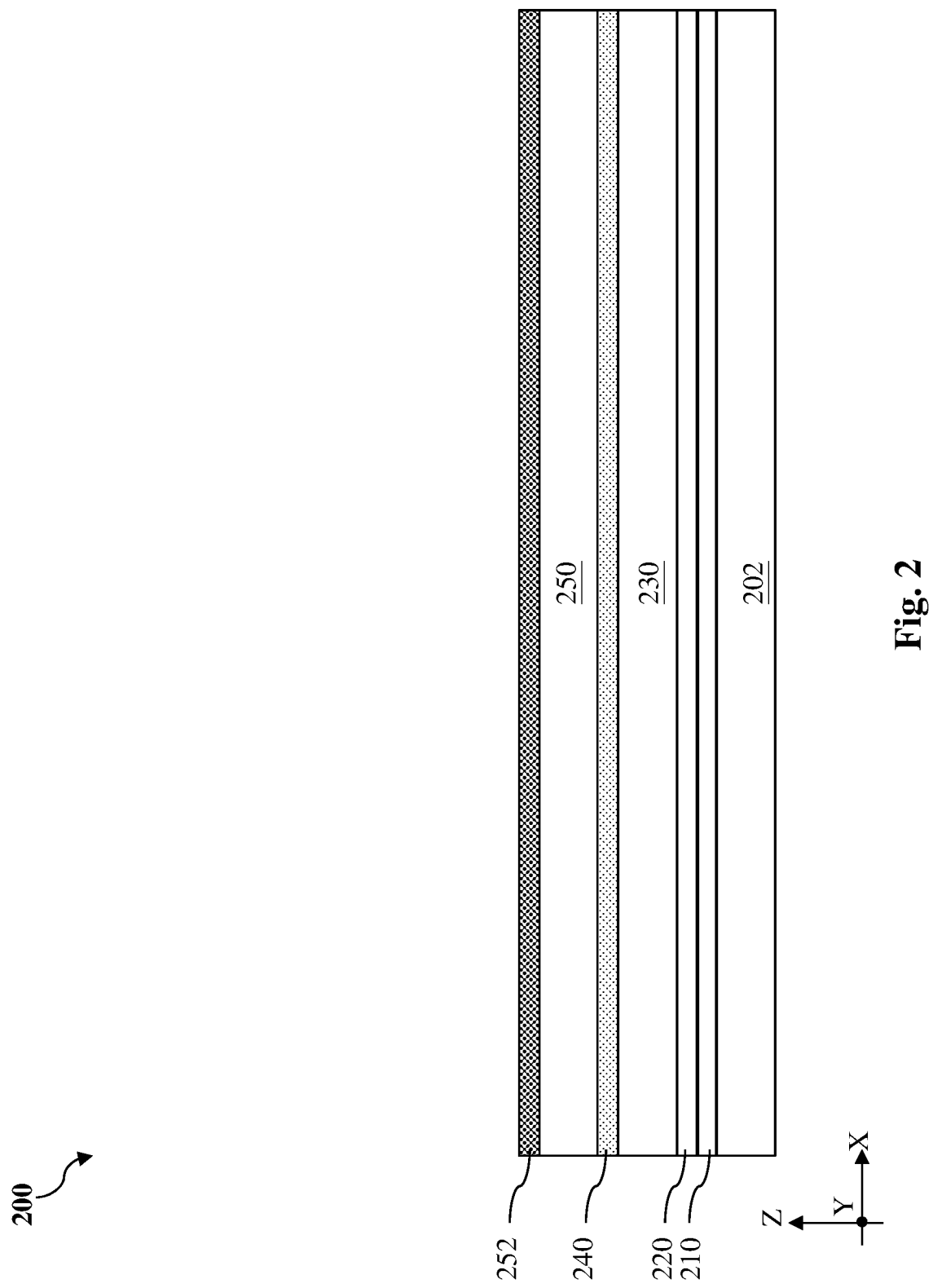
FIGS. 2-14 are fragmentary cross-sectional views of a workpiece at various stages of fabrication according to the method in FIG. 1.

Referring to FIGS. 1 and 2, method 100 includes a block 102 where a workpiece 200 is provided. The workpiece 200 includes various layers already formed thereon. The workpiece 200 includes a substrate 202, which may be made of silicon or other semiconductor materials such as germanium. The substrate 202 also may include a compound semiconductor such as silicon carbide, gallium arsenic, indium arsenide, or indium phosphide. In some embodiments, the substrate 202 may include alloy semiconductor such as silicon germanium, silicon germanium carbide, gallium arsenic phosphide, or gallium indium phosphide. In some embodiments, the substrate 202 may include an epitaxial layer, such as an epitaxial layer overlying a bulk semiconductor. Various microelectronic components may be formed in or on the substrate 202, such as transistor components including source/drain features, gate structures, gate spacers, source/drain contacts, gate contacts, isolation structures including shallow trench isolation (STI), or any other suitable components. Transistors formed on the substrate 202 may be planar devices or multi-gate devices. Multi-gate devices include, for example, fin-like field effect transistors (FinFETs) or multi-bridge-channel (MBC) transistors. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

The workpiece 200 also includes a multi-layered interconnect (MLI) structure 210, which provides interconnections (e.g., wiring) between the various microelectronic components of the workpiece 200. The MLI structure 210 may also be referred to as an interconnect structure 210. The interconnect structure 210 may include multiple metal layers or metallization layers. In some instances, the interconnect structure 210 may include eight (8) to fourteen (14) metal layers. Each of the metal layers includes multiple conductive components embedded in an intermetal dielectric (IMD) layer. The conductive components may include contacts, vias, or metal lines. The IMD layer may be a silicon oxide or silicon-oxide-containing material where silicon exists in various suitable forms. As an example, the IMD layer includes silicon oxide or a low-k dielectric material having k-value (dielectric constant) smaller than that of silicon oxide, which is about 3.9. In some embodiments, the low-k dielectric material includes a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof.

In an embodiment, a carbide layer 220 is deposited on the interconnect structure 210. The deposition process includes chemical vapor deposition (CVD), physical vapor deposition (PVD), atomic layer deposition (ALD), or combinations thereof. In some embodiments, the carbide layer 220 has a generally uniform thickness of between about 45 nm and about 70 nm. Any suitable type of carbide material such as silicon carbide (SiC) can be used in the carbide layer 220.

In an embodiment, an oxide layer 230 is deposited on the carbide layer 220. Any suitable deposition process for the oxide layer 230 may be used, including CVD, flowable CVD (FCVD), spin-on coating, PVD, ALD, or combinations thereof. In some embodiments, the oxide layer 230 includes undoped silicon oxide. In some instances, the oxide layer 230 may include a thickness between about 500 nm and about 700 nm.

In an embodiment, an etch stop layer (ESL) 240 is deposited on the oxide layer 230. In some embodiments, the ESL 240 is about 45 to about 55 nm thick. The ESL 240 may include silicon carbonitride (SiCN), silicon oxycarbide (SiOC), silicon carbide (SiC), silicon oxycarbonitride (SiOCN), or silicon nitride (SiN), or combinations thereof.

A first dielectric layer 250 may be deposited on the etch stop layer 240. In some embodiments, the first dielectric layer 250 includes undoped silica glass (USG) or silicon oxide. In some embodiments, the first dielectric layer 250 is about 800 nm to about 1000 nm thick. A composition of the first dielectric layer 250 may be similar to that of the oxide layer 230. The first dielectric layer 250 may be deposited using CVD, flowable CVD (FCVD), spin-on coating, PVD, ALD, or combinations thereof.

Figure 3:
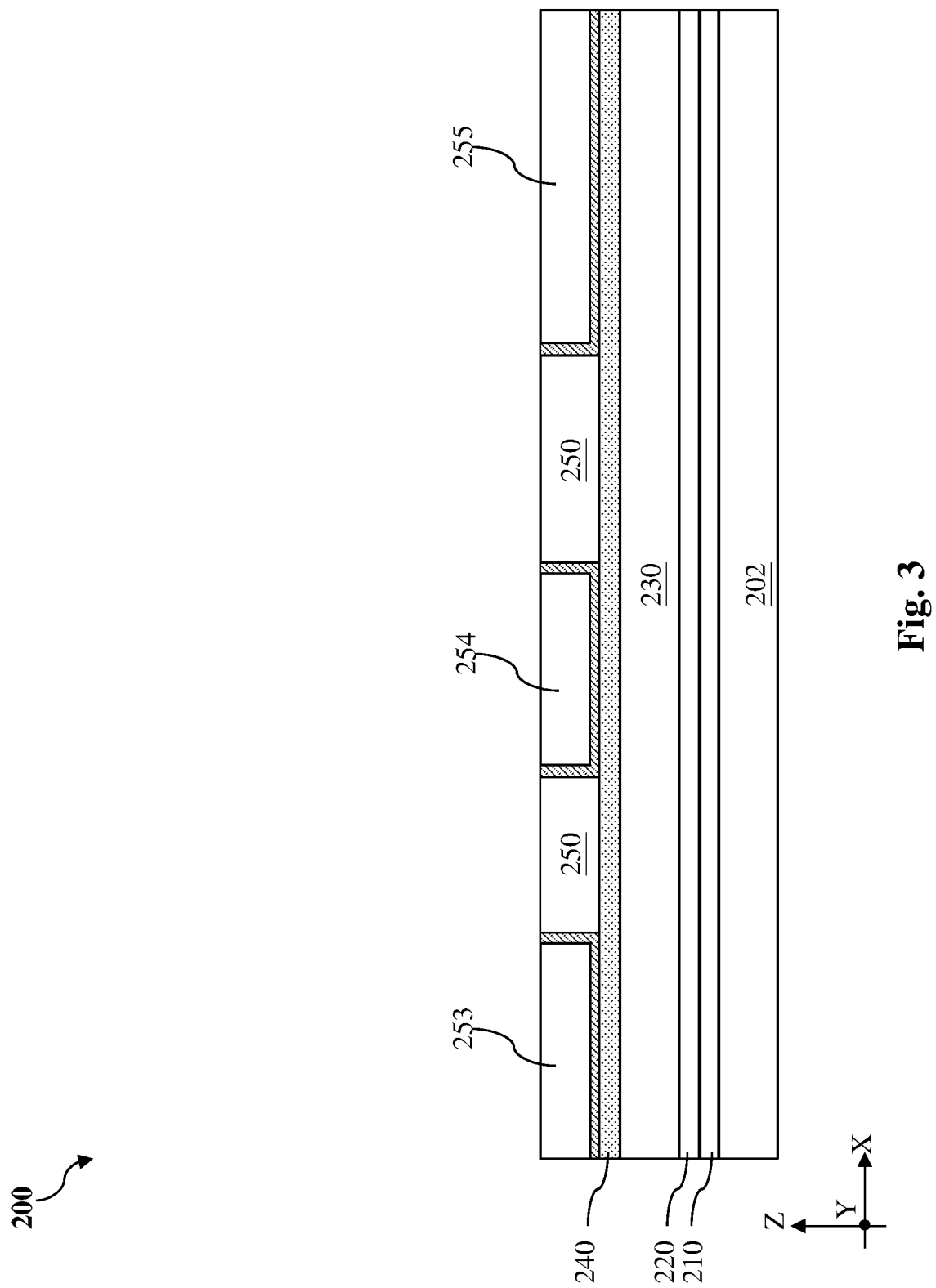

Referring to FIGS. 1, 2 and 3, method 100 includes a block 104 where lower contact features 253, 254 and 255 are formed in the first dielectric layer 250. Operations at block 104 may include patterning of the first dielectric layer 250 to form trenches and deposition of a barrier layer and a metal fill layer in the trenches. In some implementations, patterning the first dielectric layer 250 involves multiple processes. As shown in FIG. 2, a hard mask layer 252 is deposited on the first dielectric layer 250. In some embodiments, the hard mask layer 252 is about 54 nm to about 66 nm thick. In some instances, the hard mask layer 252 may include silicon oxynitride. The hard mask layer 252 is then patterned, for example, using a photolithography process. The first dielectric layer 250 is etched using the hard mask layer 252 as an etch mask to form trenches. As shown in FIG. 3, the hard mask layer 252 is removed after being used as an etch mask, leaving behind a patterned first dielectric layer 250 with trenches. A barrier layer and a metal fill layer are then deposited over the workpiece 200, including the trenches. In some embodiments, the barrier layer may include titanium nitride or tantalum nitride and may be conformally deposited using PVD, CVD, metalorganic CVD (MOCVD), or a suitable method. In one embodiments, the barrier layer may include tantalum nitride. The metal fill layer may include copper and may be deposited using electroplating or electroless plating. In an example process, a seed layer is first deposited over the workpiece 200 and then an electrode plating process is performed to fill the trench with copper. In some instances, the seed layer may include copper, titanium, or a combination thereof. After the barrier layer and the metal fill layer are deposited, a planarization process, such as a chemical mechanical planarization (CMP) process, may be performed to remove excess barrier layer and metal fill layer to form the lower contact features 253, 254 and 255. Although the lower contact features 253, 254, and 255 are disposed below upper contact features (to be discussed below), the lower contact features 253, 254, and 255 are sometimes referred to as top metal (TM) contacts.

Figure 4:
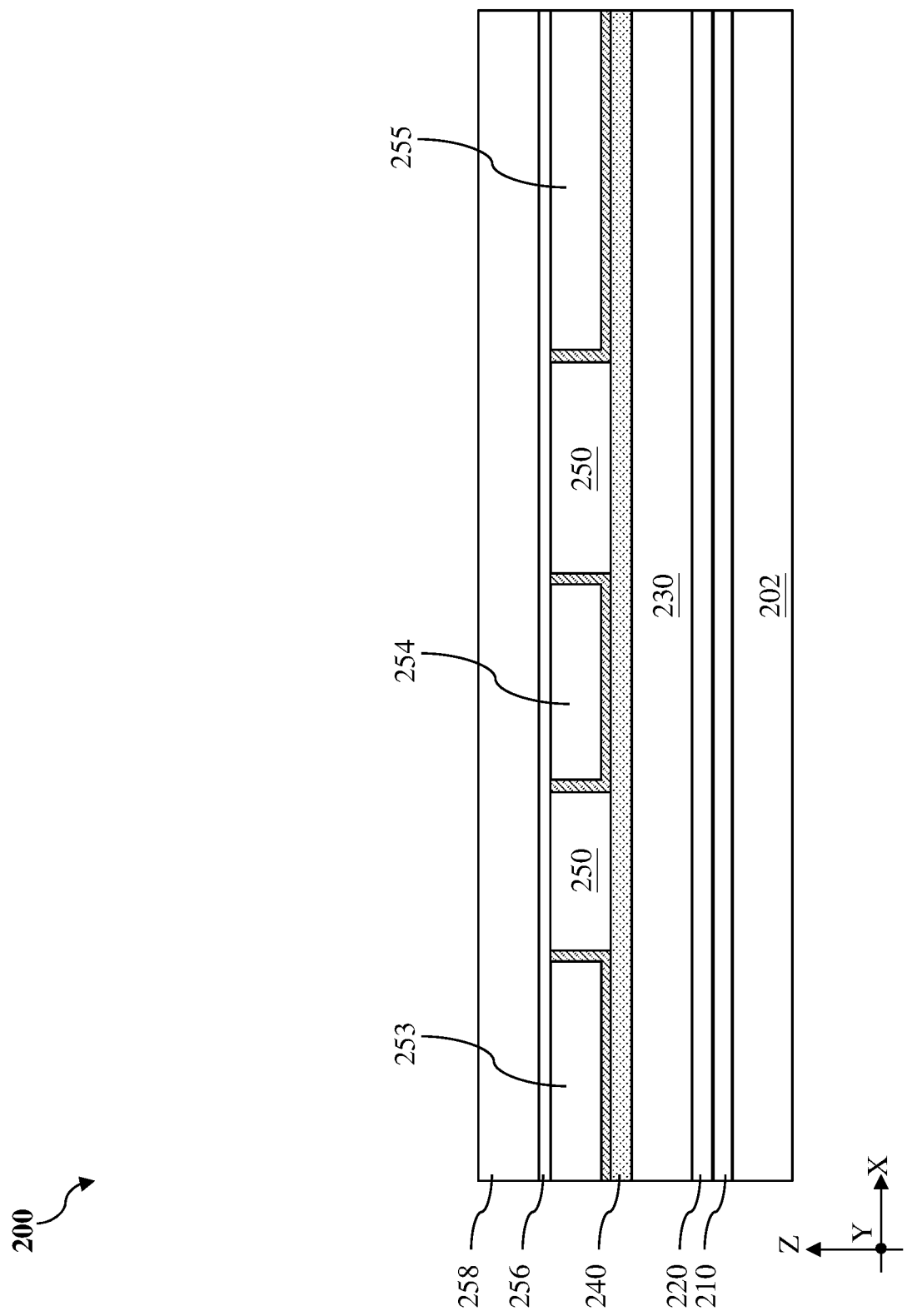

Referring to FIGS. 1 and 4, method 100 includes a block 106 where a second dielectric layer 256 and a third dielectric layer 258 are deposited over the lower contact features 253, 254, and 255. In some embodiments, the second dielectric layer 256 may include silicon carbonitride (SiCN), silicon nitride (SiN), and/or or other suitable materials that may protect the lower contact features 253, 254, and 255 from being oxidized. The second dielectric layer 256 may have a thickness about 65 nm to about 85 nm. After the deposition of the second dielectric layer 256, a third dielectric layer 258 is deposited over the second dielectric layer 256. In some embodiments, the third dielectric layer 258 is about 300 nm to about 500 nm thick. The third dielectric layer 258 may include an oxide material, such as undoped silica glass (USG), or other suitable material(s). The second dielectric layer 256 and the third dielectric layer 258 may be deposited using CVD, PECVD, or a suitable method.

Referring to FIGS. 1 and 5-9, method 100 includes a block 108 where a metal-insulator-metal (MIM) structure 260 (shown in FIG. 9) is formed over the third dielectric layer 258. As shown in FIGS. 5-9, forming the MIM structure 260 involves multiple processes, including deposition of a first conductor plate layer 262 (shown in FIG. 5), patterning of the first conductor plate layer 262 (shown in FIG. 5), deposition of a first insulator layer 264 (shown in FIG. 6), deposition of a second conductor plate layer 266 (shown in FIG. 7), patterning of the second conductor plate layer 266 (shown in FIG. 7), deposition of a second insulator layer 268 (shown in FIG. 8), deposition of a third conductor plate layer 269 (shown in FIG. 9), patterning of the third conductor plate layer 269 (shown in FIG. 9).

Figure 5:
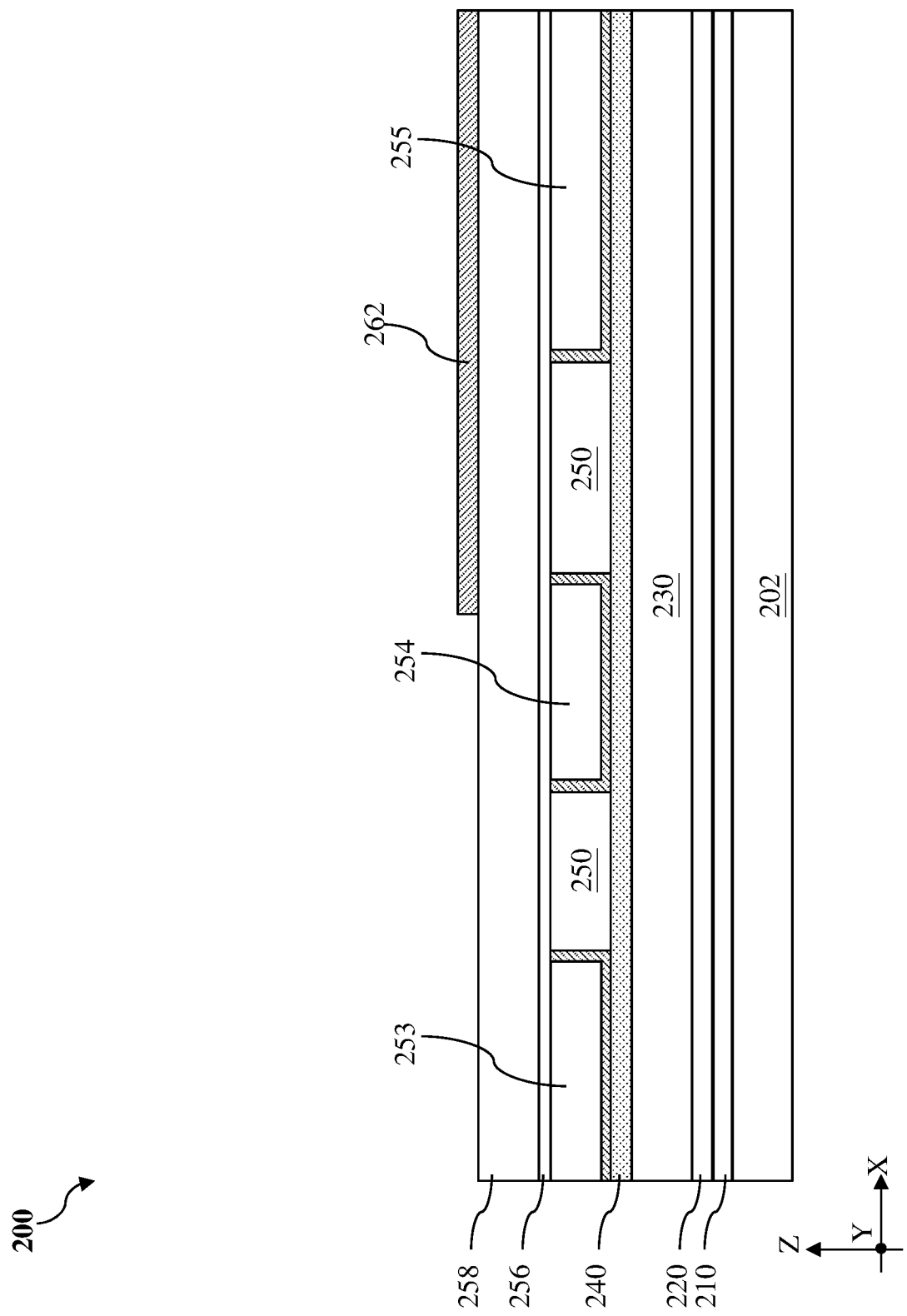

As shown in FIG. 5, a first conductor plate layer 262 is first deposited on the third dielectric layer 258 using PVD, CVD, or MOCVD. In some embodiments, the first conductor plate layer 262 may include a transition metal or a transition metal nitride. For example, the first conductor plate layer 262 may include titanium (Ti), tantalum (Ta), titanium nitride (TiN), or tantalum nitride (TaN). In one embodiment, the first conductor plate layer 262 includes titanium nitride (TiN). In some alternative embodiments, the first conductor plate layer 262 may include copper (Cu), cobalt (Co), nickel (Ni), tungsten (W), or aluminum (Al). In some instances, the first conductor plate layer 262 is about 30 nm to about 80 nm thick. The deposited first conductor plate layer 262 may cover an entire top surface of the workpiece 200. The deposited first conductor plate layer 262 is then patterned. The patterning may include deposition of a hard mask layer over the first conductor plate layer 262, deposition of a photoresist layer over the hard mask layer, patterning of the photoresist layer using photolithography, etching of the hard mask layer using the patterned photoresist layer as an etch mask, and then etching of the first conductor plate layer 262 using the patterned hard mask using the etch mask. The patterned first conductor plate layer 262 may also go through surface treatment such as sidewall passivation using a nitrous oxide ($N_2O$) gas.

Figure 15:
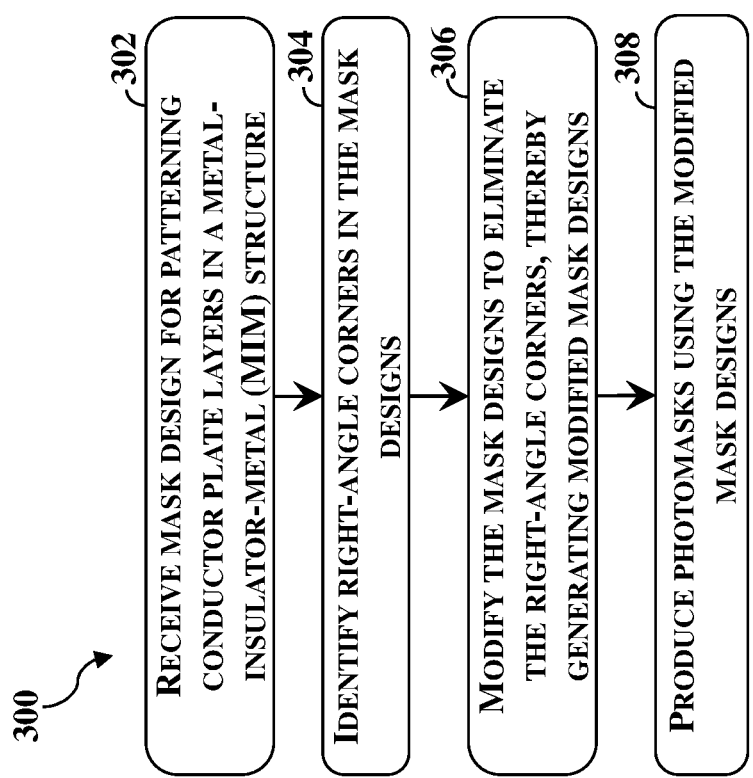
FIG. 15 is a flow chart of a method for eliminating right-angle corners of a conductor plate layer, according to various aspects of the present disclosure.

According to the present disclosure, masks used in the photolithography are produced using methods representatively shown as method 300 in FIG. 15. The goal of method 300 or methods represented by method 300 is to eliminate right-angle corners of the patterned conductor plate layer. As described above, mechanical stress may accumulate or be concentration near or around right-angle corners, leading to increased defect density. Elimination of the right-angle corners or transformation of the right-angle corners into obtuse-angle corners reduce stress accumulation or concentration, thereby reducing defect density.

As shown in FIG. 15, method 300 includes blocks 302, 304, 306, and 308. Operations of method 300 will be described in conjunction with FIG. 16, which illustrates an example mask pattern undergoing method 300. At block 302, mask designs for patterning conductor plate layers in an MIM structure are received. The mask designs includes those for the first conductor plate layer 262, a second conductor plate layer 266 (to be described below), and a third conductor plate layer 269 (to be described below). With respect to the first conductor plate layer 262, the mask design used to pattern the first conductor plate layer 262 may include a mask pattern 400 shown in FIG. 16. At block 304, all right-angle corners of the mask pattern 400 are identified. For ease of design and fabrication, the mask pattern 400 includes multiple right-angle corners, such as interior right-angle corners 402, 404, 406, 408, and 410 and an exterior right-angle corner 412. As used herein, an interior right-angle corner refers to a corner of the mask pattern 400, which measures substantially 90 degree (90°) from inside of the corner of the mask pattern 400. A right angle notation for an interior right-angle corner, such as the interior right-angle corners 402, 404, 406, 408, and 410, is located within the mask pattern 400. An exterior right-angle corner refers to a corner of the mask pattern 400, which measures substantially 90 degree (90°) from outside of the corner of the mask pattern 400. A right angle notation for an exterior right-angle corner, such as the exterior right-angle corner 412, is located outside the mask pattern 400.

Figure 16:
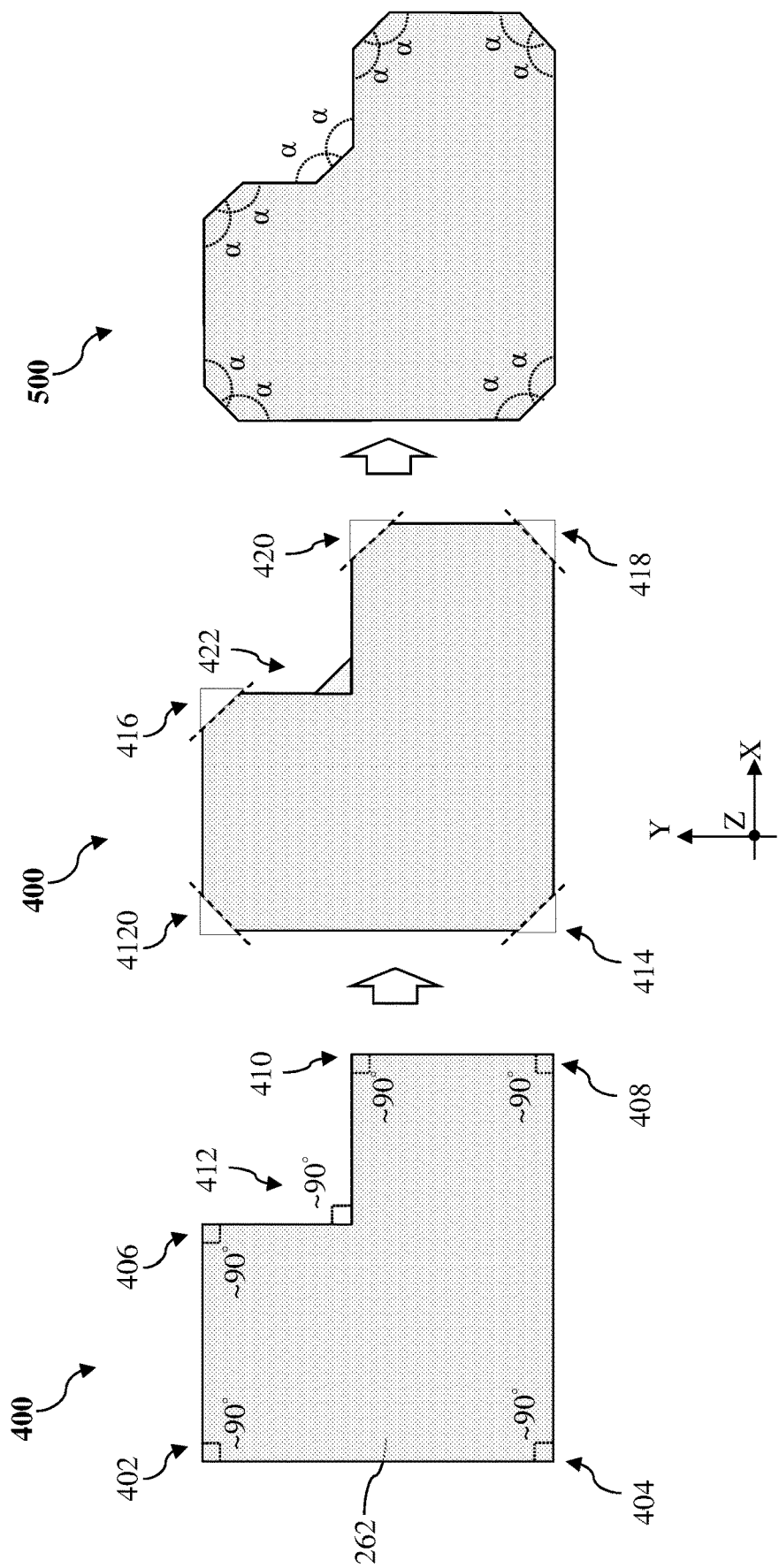
FIG. 16 is a schematic illustration of how right interior corners and right exterior corners are removed, according to various aspects of the present disclosure.

Referring still to FIG. 15, block 306 modifies the mask designs to eliminate the right-angle corners, thereby generating modified mask designs. Operations at block 306 may be representatively illustrated in FIG. 16. To eliminate the right-angle corners 402, 404, 406, 408, 410, and 412 of the mask pattern 400, a mask house may modify the mask pattern 400 by performing a cut operation to an interior right-angle corner or a fill operation to an exterior right-angle corner. In the illustrated example, a right angle triangle area may be removed from an interior right-angle corner to eliminate the interior right-angle corner. Here, elimination of a right-angle corner refers to turning or transforming a right-angle corner into a corner of an obtuse angle. As shown in FIG. 16, the removal of the right angle triangular area resembles a straight corner cut. A cut 4120 may be performed to the interior right-angle corner 402; a cut 414 may be performed to the interior right-angle corner 404; a cut 416 may be performed to the interior right-angle corner 406; a cut 418 may be performed to the interior right-angle corner 408; and a cut 420 may be performed to the interior right-angle corner 410. A right angle triangle area may be filled into an exterior right-angle corner to eliminate the exterior right-angle corner. As shown in FIG. 16, a triangular filling 422 may be performed to the exterior right-angle corner 412 to turn the exterior right-angle corner 412 into an obtuse-angle corner.

In some embodiments, the removed or fill-in right angle triangular area at block 306 is a right angle isosceles triangle with two 45-degree angles and one right angle. The adoption of the right angle isosceles triangles is not trivial. While multiple straight cuts or triangular fills may result in a substantially rounded corner, the incremental stress reduction does not justify the cost associated with implementing multiple cuts. Reference is still made to FIG. 16. When each of the removed or fill-in right angle triangular area at block 306 is a right angle isosceles triangle, each of the interior right-angle corners 402, 404, 406, 408, and 410 and the exterior right-angle corner 408 is turned into a corner having two obtuse angles α, which is about 135°. Experimental results show that corners with obtuse angles α exhibit substantial improvement with respect to stress concentration or accumulation and can result in substantial reduction of defect density. The modification of the mask designs at block 306 generates modified mask designs that include modified mask patterns such as a modified mask pattern 500 shown in FIG. 16. As described above, the modified mask pattern 500 is free of right-angle corners. In the depicted embodiments, each corner of the modified mask pattern 500 is featured with the obtuse angle α, which is about 50% greater than the right angle. In some implementations, the operation at block 306 may be performed along with optical proximity correction (OPC) operations.

At block 308, photomasks are produced using the modified mask designs. In some embodiments, the modified mask designs may be transferred to a mask substrate (e.g., quartz glass, fused silica, $CaF_2$) by laser writing or E-beam writing to form the photomask.

Reference is then made back to FIG. 5. At block 108, the deposited first conductor plate layer 262 is patterned using the photomask generated using method 300. As such, instead of having multiple right-angle corners, the patterned first conductor plate layer 262 includes obtuse-angle corners, similar to the obtuse angles α in the modified mask pattern 500 in FIG. 16.

Figure 6:
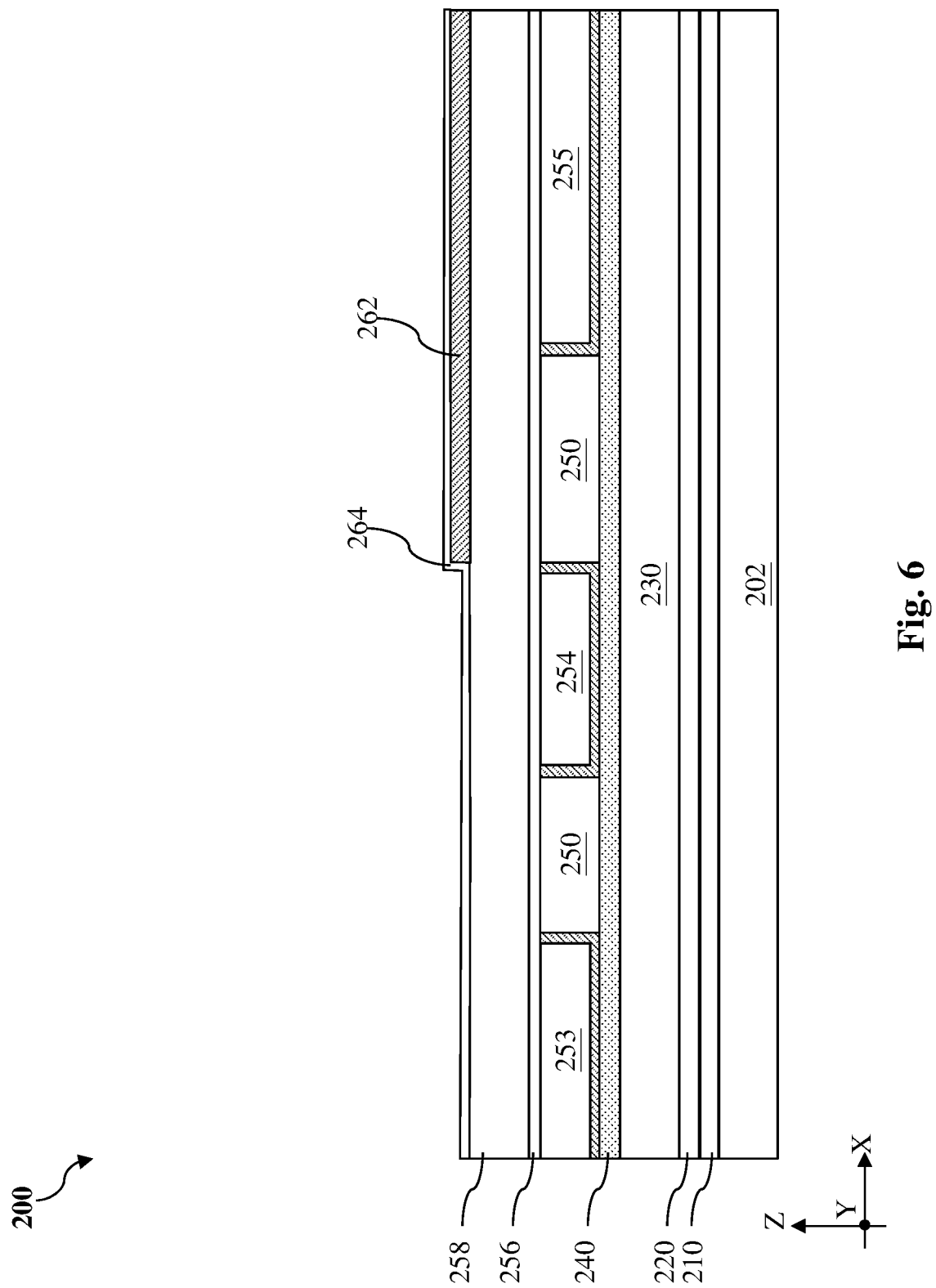

As shown in FIG. 6, after the first conductor plate layer 262 is patterned, a first insulator layer 264 is deposited on the patterned first conductor plate layer 262. In an embodiment, the first insulator layer 264 is conformally deposited to have a generally uniform thickness over the top surface of the workpiece 200 (e.g., having about the same thickness on top and sidewall surfaces of the first conductor plate layer 262). The first insulator layer 264 may be deposited using CVD, ALD, or a suitable deposition method. The first insulator layer 264 may be include hafnium oxide, aluminum oxide, zirconium oxide, titanium oxide, tantalum oxide, or a combination thereof. The first insulator layer 264 may be a single layer or a multi-layer. In one embodiment, the first insulator layer 264 is a multi-layer and includes a first zirconium oxide layer, an aluminum oxide layer disposed on the first zirconium oxide layer, and a second zirconium oxide layer over the aluminum oxide layer. In some instances, the first insulator layer 264 may have a thickness between about 4 nm and about 10 nm, such as between about 5 nm and about 7 nm. In the depicted embodiment where the first insulator layer 264 includes the first zirconium oxide layer, the aluminum oxide layer and the second zirconium oxide layer, each of the sub-layers has the same thickness.

Figure 7:
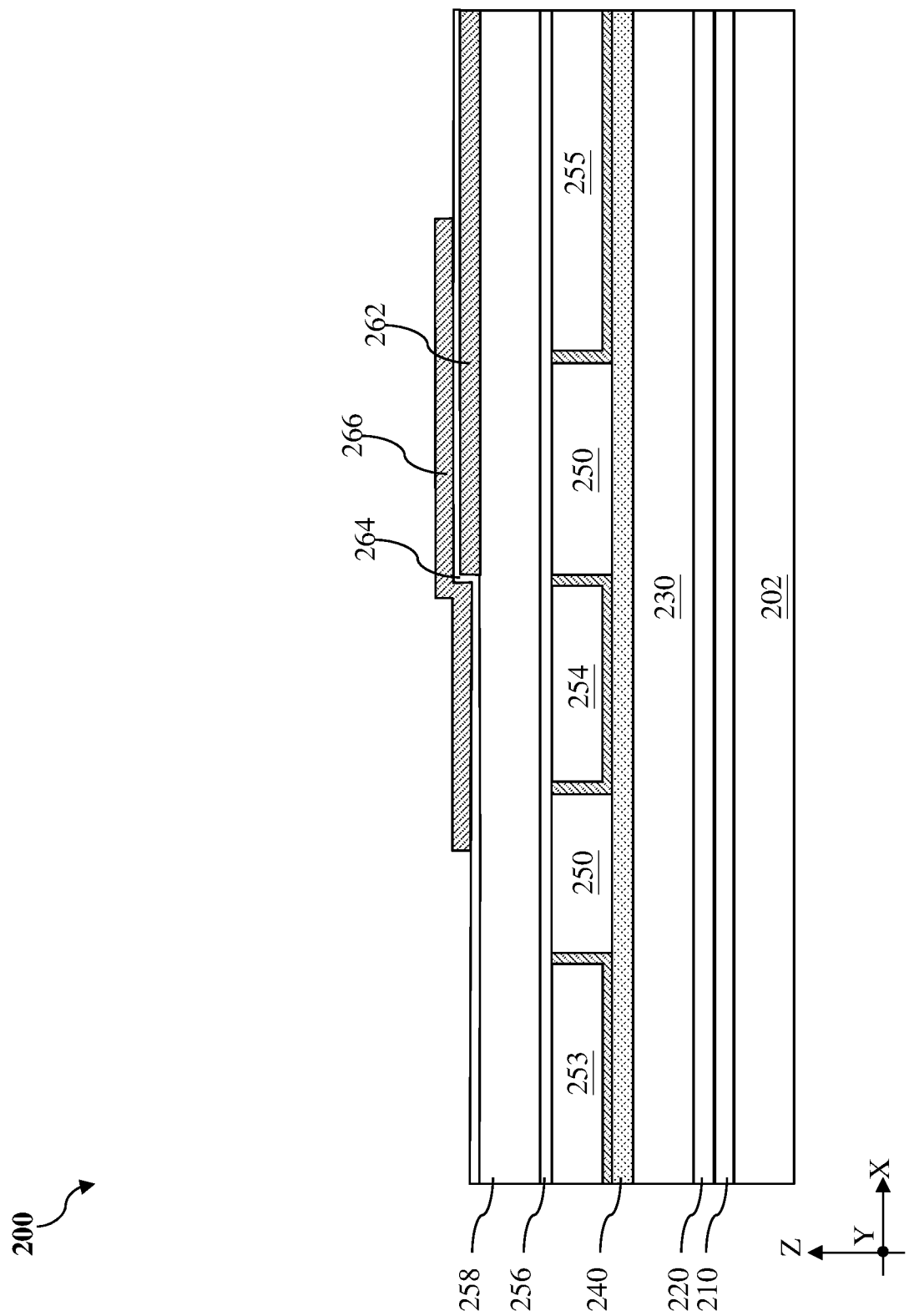

As shown in FIG. 7, a patterned second conductor plate layer 266 is formed on the first insulator layer 264. The second conductor plate layer 266 may be formed in a way similar to that used to form the first conductor plate layer 262, but the pattern of the second conductor plate layer 266 may be different from that of the first conductor plate layer 262. In some embodiments, the second conductor plate layer 266 may be deposited over the first insulator layer 264 using PVD, CVD, or MOCVD. In some embodiments, the second conductor plate layer 266 may include a transition metal or a transition metal nitride. For example, the second conductor plate layer 266 may include titanium (Ti), tantalum (Ta), titanium nitride (TiN), or tantalum nitride (TaN). In one embodiment, the second conductor plate layer 266 includes titanium nitride (TiN). In some alternative embodiments, the second conductor plate layer 266 may include copper (Cu), cobalt (Co), nickel (Ni), tungsten (W), or aluminum (Al). In some instances, the second conductor plate layer 266 is about 30 nm to about 80 nm thick. The deposited second conductor plate layer 266 may cover an entire top surface of the workpiece 200. Like the first conductor plate layer 262, the deposited second conductor plate layer 266 is then patterned using the photomask generated using method 300. As such, instead of having multiple right-angle corners, the patterned second conductor plate layer 266 includes obtuse-angle corners, similar to the obtuse angles α in the modified mask pattern 500 in FIG. 16. The patterning may include deposition of a hard mask layer over the second conductor plate layer 266, deposition of a photoresist layer over the hard mask layer, patterning of the photoresist layer using photolithography, etching of the hard mask layer using the patterned photoresist layer as an etch mask, and then etching of the second conductor plate layer 266 using the patterned hard mask using the etch mask. The patterned second conductor plate layer 266 may also go through surface treatment such as sidewall passivation using a nitrous oxide ($N_2O$) gas.

Figure 8:
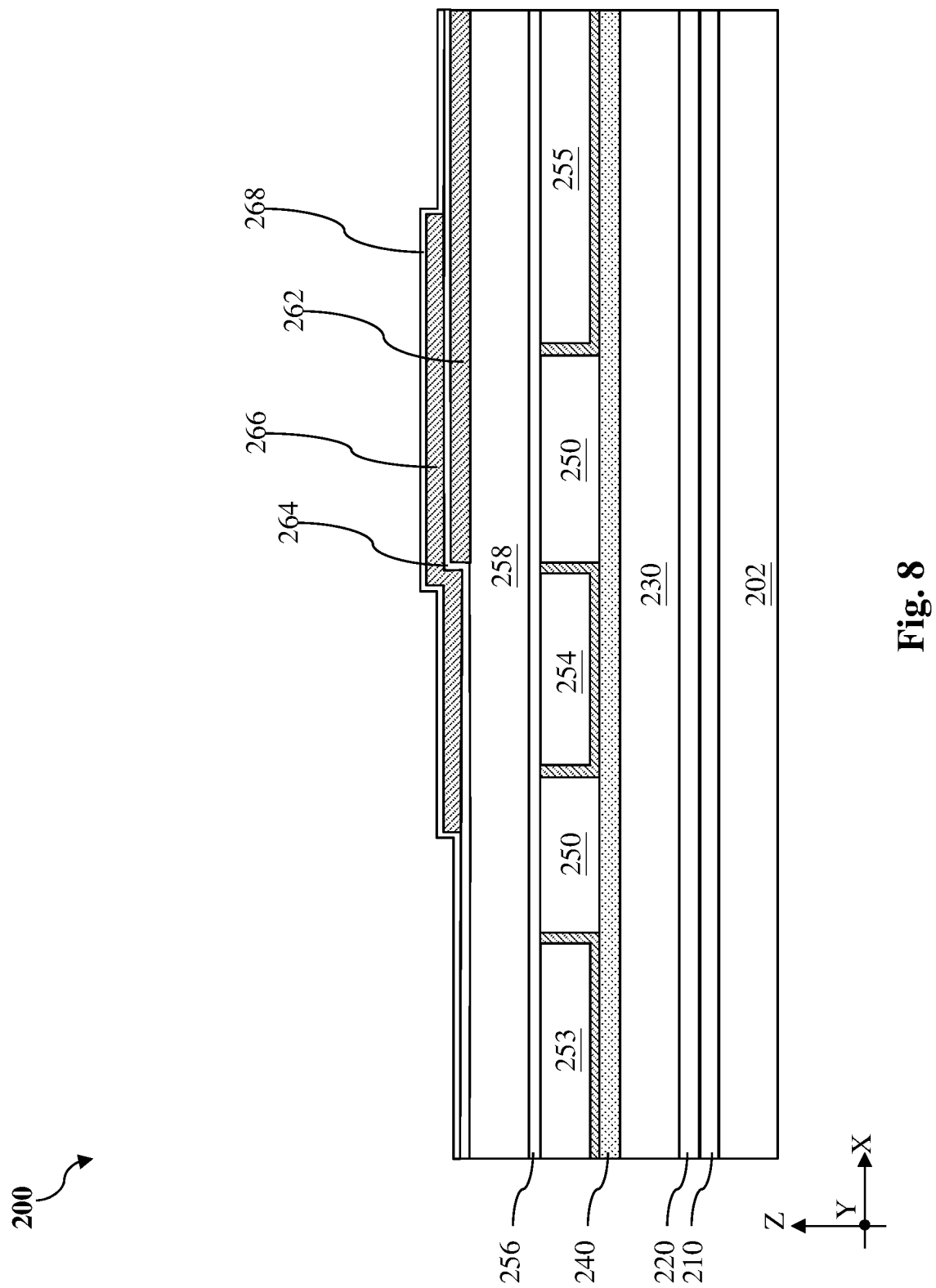

As shown in FIG. 8, a second insulator layer 268 is formed on the second conductor plate layer 266. In an embodiment, the second insulator layer 268 is conformally deposited to have a generally uniform thickness over the top surface of the workpiece 200 (e.g., having about the same thickness on top and sidewall surfaces of the second conductor plate layer 266). The second insulator layer 268 may be deposited using CVD, ALD, or a suitable deposition method. The second insulator layer 268 may be include hafnium oxide, aluminum oxide, zirconium oxide, titanium oxide, tantalum oxide, or a combination thereof. The second insulator layer 268 may be a single layer or a multi-layer. In one embodiment, the second insulator layer 268 is a multi-layer and includes a first zirconium oxide layer, an aluminum oxide layer disposed on the first zirconium oxide layer, and a second zirconium oxide layer over the aluminum oxide layer. In some instances, the second insulator layer 268 may have a thickness between about 4 nm and about 10 nm, such as between about 5 nm and about 7 nm. In the depicted embodiment where the second insulator layer 268 includes the first zirconium oxide layer, the aluminum oxide layer and the second zirconium oxide layer, each of the sub-layers has the same thickness.

Figure 9:
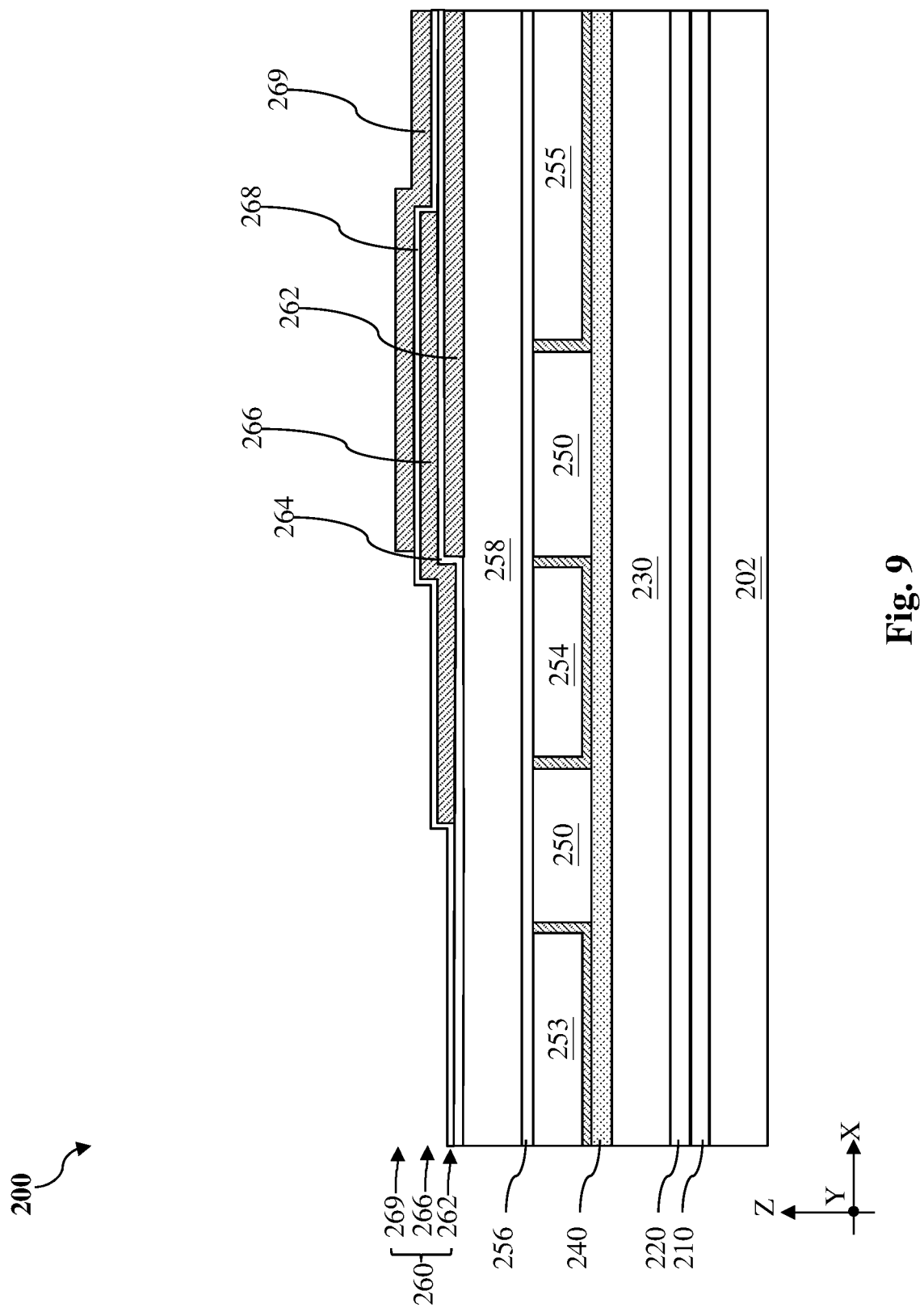

As shown in FIG. 9, a patterned third conductor plate layer 269 is formed on the second insulator layer 268. The third conductor plate layer 269 may be formed in a way similar to that used to form the second conductor plate layer 266 or the first conductor plate layer 262, but the pattern of the third conductor plate layer 269 may be different from that of the second conductor plate layer 266 or the first conductor plate layer 262. In some embodiments, the third conductor plate layer 269 may be deposited over the second insulator layer 268 using PVD, CVD, or MOCVD. In some embodiments, the third conductor plate layer 269 may include a transition metal or a transition metal nitride. For example, the third conductor plate layer 269 may include titanium (Ti), tantalum (Ta), titanium nitride (TiN), or tantalum nitride (TaN). In one embodiment, the third conductor plate layer 269 includes titanium nitride (TiN). In some alternative embodiments, the third conductor plate layer 269 may include copper (Cu), cobalt (Co), nickel (Ni), tungsten (W), or aluminum (Al). In some instances, the third conductor plate layer 269 is about 30 nm to about 80 nm thick. The deposited third conductor plate layer 269 may cover an entire top surface of the workpiece 200. The deposited third conductor plate layer 269 is then patterned. The patterning may include deposition of a hard mask layer over the third conductor plate layer 269, deposition of a photoresist layer over the hard mask layer, patterning of the photoresist layer using photolithography, etching of the hard mask layer using the patterned photoresist layer as an etch mask, and then etching of the third conductor plate layer 269 using the patterned hard mask using the etch mask. The patterned third conductor plate layer 269 may also go through surface treatment such as sidewall passivation using a nitrous oxide ($N_2O$) gas.

As illustrated in FIG. 9, the MIM structure 260 includes multiple metal layers, including the first conductor plate layer 262, the second conductor plate layer 266, and the third conductor plate layer 269, which function as metal plates. The MIM structure 260 also includes multiple insulator layers including, the first insulator layer 264 disposed between the first conductor plate layer 262 and the second conductor plate layer 266, as well as the second insulator layer 268 disposed between the second conductor plate layer 266 and the third conductor plate layer 269. The MIM structure 260 may be implemented as one or more capacitors, which may be connected to other electric components such as transistors. While the MIM structure 260 depicted in the present disclosure includes three conductor plate layers, an MIM structure according to the present disclosure may include more than 3 conductor plate layers, such as 4, 5, 6, or even more conductor plate layers. Adjacent conductor plate layers are insulated from one another by an insulator layer, similar to the first insulator layer 264 and the second insulator layer 268.

Figure 20:
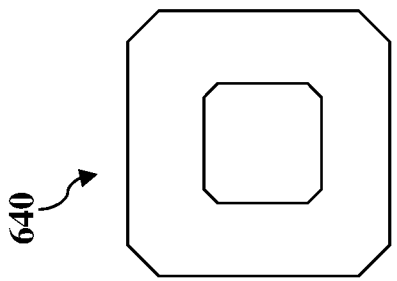
FIGS. 17-22 are conductor plate layers of different geometrical shapes, according to various aspects of the present disclosure.
Figure 19:
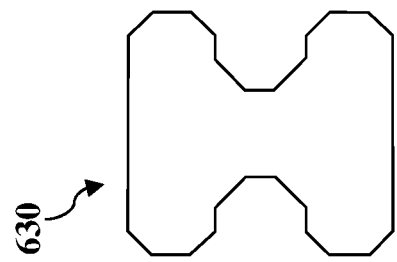
Figure 22:
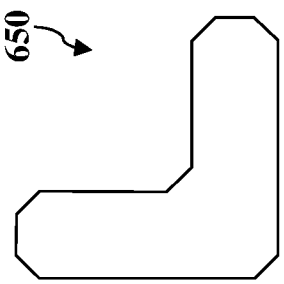
Figure 18:
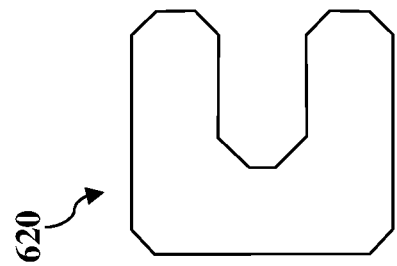
Figure 21:
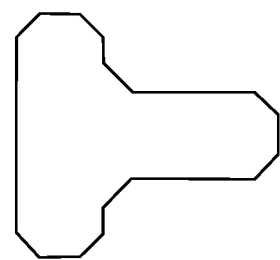
Figure 17:
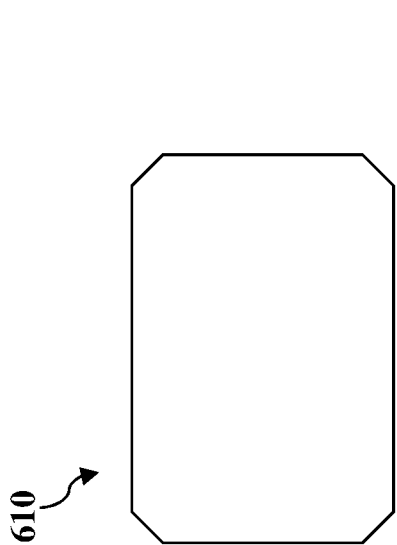

Depending on the mask pattern in the mask design being modified by method 300 in FIG. 15, the modified mask pattern or the patterned conductor plate layers in the MIM structure 260 may have different shapes that are free of right-angle corners. Examples of top-view shapes of the conductor plate layers are shown in FIGS. 17-22. FIG. 17 illustrates a rectangle 610 with all four right-angle corners transformed into obtuse-angle corners. FIG. 18 illustrates a C-shape 620 with all right-angle corners transformed into obtuse-angle corners. FIG. 19 illustrates an I-shape 630 with all right-angle corners transformed into obtuse-angle corners. FIG. 20 illustrates a hollow rectangle 640 with all interior and exterior right angle corners turned into obtuse-angle corners. FIG. 21 illustrates an L-shape 650 with all right-angle corners transformed into obtuse-angle corners. FIG. 22 illustrates a T-shape 660 with all right-angle corners transformed into obtuse-angle corners. None of the top-view shapes in FIGS. 17-20 includes a corner having an angle equal to or smaller than 90°

While not explicitly shown in the figures, the MIM structure 260 includes dummy plates that are deposited simultaneously with the conductor plate layers but are severed from the conductor plate layers during the patterning of the conductor plate layers. Because right-angle corners of the dummy plates have the same propensity to accumulate or concentrate stress, dummy plates are also patterned using the photomask from method 300 to remove all interior right-angle corners and exterior right-angle corners.

Figure 10:
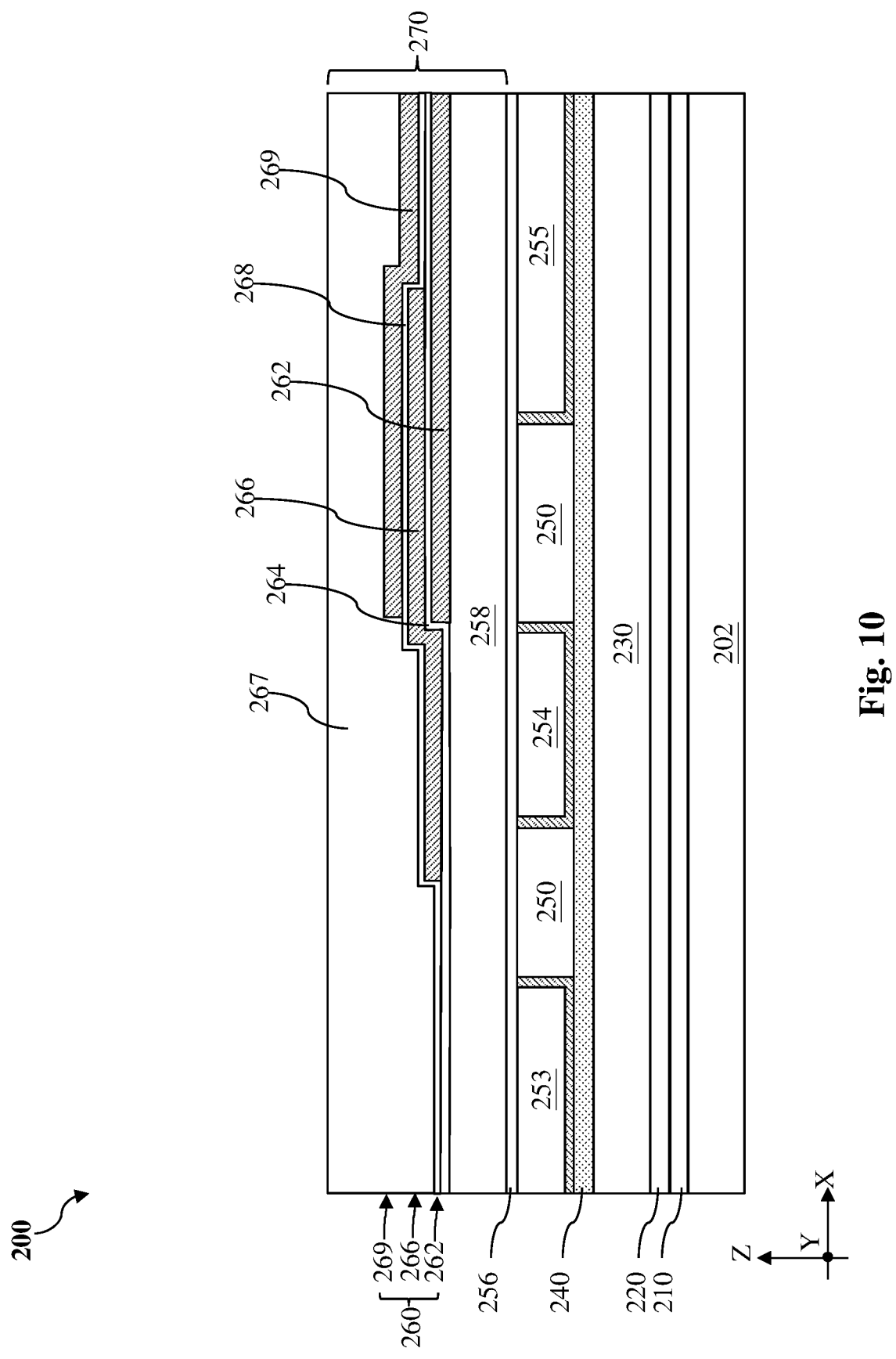

Referring to FIGS. 1 and 10, method 100 includes a block 110 where a fourth dielectric layer 267 is deposited over the MIM structure 260. In some embodiments, the fourth dielectric layer 267 is about 400 nm to about 600 nm thick. The fourth dielectric layer 267 may be formed by depositing about 900 nm to about 1000 nm of the oxide material, followed by a CMP process to reach the final thickness. As shown in FIG. 10, the MIM structure 260 is sandwiched between the third dielectric layer 258 and the fourth dielectric layer 267, which may have the same material and/or the same thickness. In some embodiments, the second dielectric layer 256, the third dielectric layer 258, the MIM structure 260, and the fourth dielectric layer 267 are regarded as parts of a first multi-layer passivation structure 270. Alternatively, if the MIM structure 260 is not present in the first multi-layer passivation structure 270, the third dielectric layer 258 and the fourth dielectric layer 267 may be combined as a single dielectric layer (e.g., about 900 nm to about 1100 nm thick) over the second dielectric layer 256.

Figure 11:
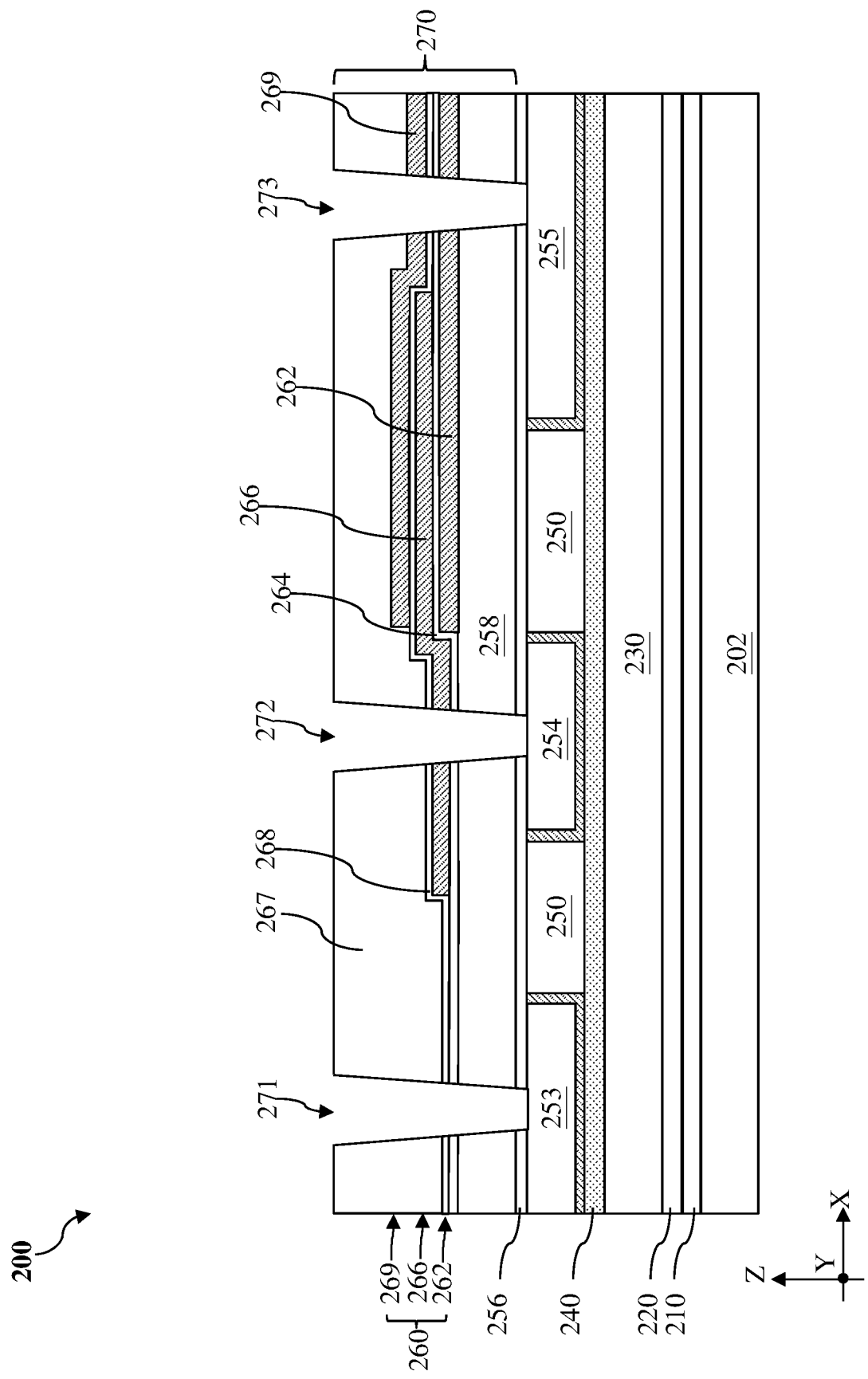

Referring to FIGS. 1 and 11, method 100 includes a block 112 where openings 271, 272, and 273 are formed to penetrate through, from top to bottom, the fourth dielectric layer 267, the MIM structure 260, the third dielectric layer 258, and the second dielectric layer 256. In some embodiments, operations at block 112 include multiple etch processes to etch through the fourth dielectric layer 267, the MIM structure 260, the third dielectric layer 258, and the second dielectric layer 256 to expose top surfaces of the lower contact features 253, 254, and 255. The multiple etch processes may include, for example, a dry etch process using sulfur hexafluoride ($SF_6$) as an etchant, a dry etch process using a chlorine-based etchant (e.g., $Cl_2$), and a dry etch using carbon tetrafluoride ($CF_4$) as an etchant. A dry etch process using a chlorine-based etchant may be suitable to etch through the MIM structure 260 as it tends to produce volatile or easy-to-remove byproducts. A dry etch process using carbon tetrafluoride may be used when the lower contact features 253, 254 and 255 are about to be exposed. Carbon tetrafluoride is less likely to cause corrosion of copper, which accounts for the composition of the lower contact features. As shown in FIG. 11, the first opening 271 does not extend through any of the conductor plate layers, the second opening 272 extends through the second conductor plate layer 266, and the third opening 273 extends through the first conductor plate layer 262 and the third conductor plate layer 269. That is, sidewalls of the second conductor plate layer 266 are exposed in the second opening 272 and sidewalls of the first conductor plate layer 262 and the third conductor plate layer 269 are exposed in the third opening 273. To remove debris and residues from the etch processes, a wet clean process may be performed. The wet clean process may include use of ammonium-hydroxide, hydrogen-peroxide, hydrochloric acid, deionized (DI) water, or a mixture thereof.

Figure 12:
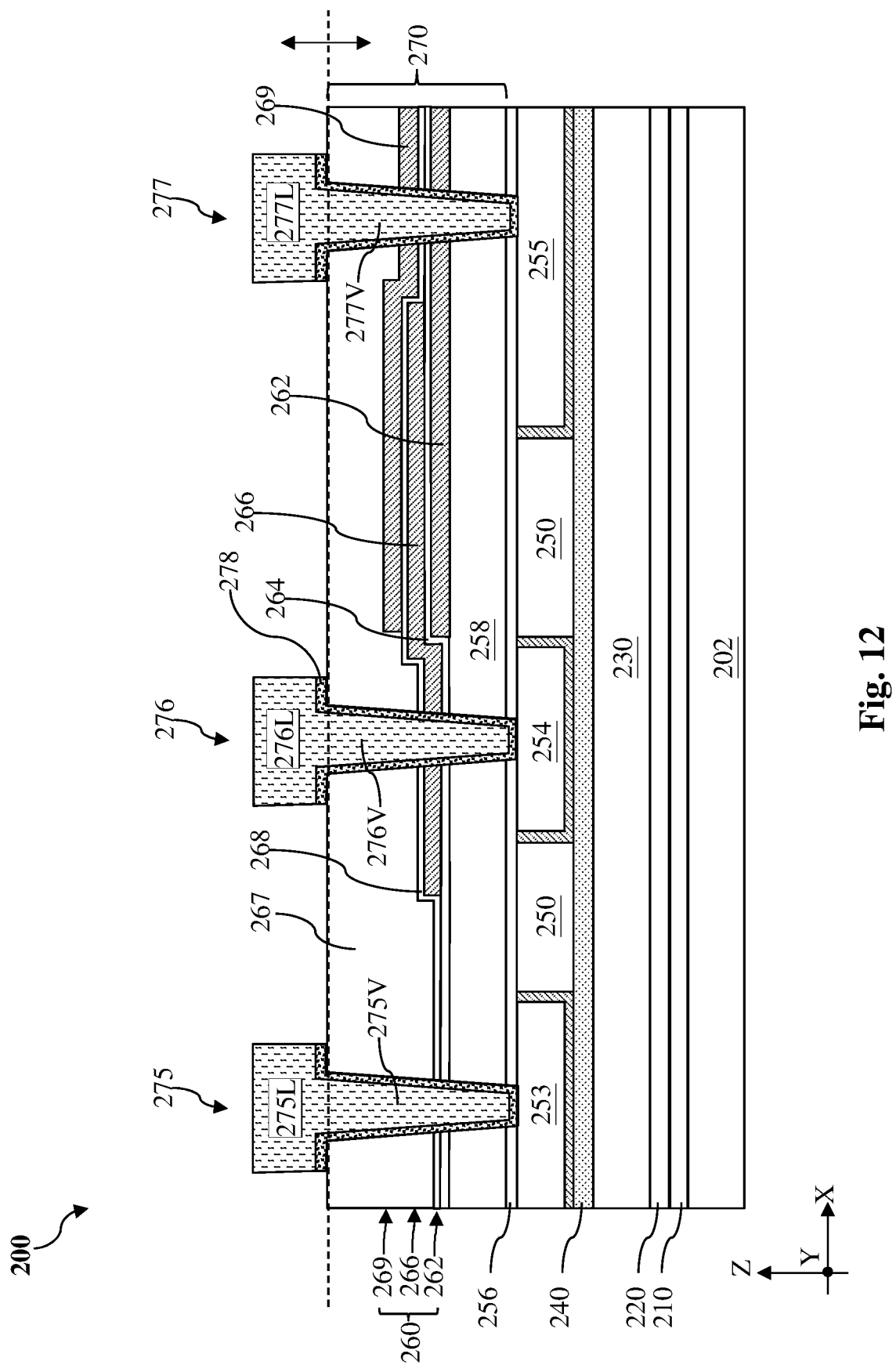

Referring to FIGS. 1 and 12, method 100 includes a block 114 where upper contact features 275, 276, and 277 are formed in and over the openings 271, 272, and 273, respectively. As indicated by the dotted lines and the arrows, each of the upper contact features 275, 276 and 277 includes a via portion and a line portion disposed over the via portion. The via portions provide vertical electrical connection and the line portions extend lengthwise along the Y direction. The first upper contact feature 275 includes a first via portion 275V and a first line portion 275L. The second upper contact feature 276 includes a second via portion 276V and a second line portion 276L. The third upper contact feature 277 includes a third via portion 277V and a third line portion 277L. The first via portion 275V fills the first opening 271. The second via portion 276V fills the second opening 272. The third via portion 277V fills the third opening 273.

In some embodiments, to form the upper contact features (such as 275, 276 and 277), a barrier layer 278 is first conformally deposited over the fourth dielectric layer 267 and into the openings 271, 272 and 273 using a suitable deposition technique, such as ALD, PVD or CVD and then a metal fill layer is deposited over the barrier layer 278 using PVD, electroless plating, or electroplating. In embodiments where the metal fill layer is deposited using electroplating, a seed layer is first deposited using PVD and then the metal fill layer is deposited using electroplating. An example seed layer may include copper, titanium, aluminum, or a combination thereof. The barrier layer 278 may include titanium nitride (TiN), tantalum nitride (TaN), or another metal nitride. The metal fill layer may be formed of copper (Cu), aluminum (Al), or an alloy thereof. In one embodiment, the barrier layer 278 includes tantalum nitride (TaN) and the metal fill layer includes aluminum copper alloy (AlCu). In some instances, the aluminum copper alloy may include about 95% of aluminum and 5% of copper. The deposited barrier layer 278 and the metal fill layer are then patterned to form upper contact features 275, 276 and 277, as illustrated in the example in FIG. 12.

The line portions 275L, 276L, and 277L may be part of a redistribution layer (RDL) to reroute bond connections between upper and lower layers. The via portions 275V, 276V, and 277V each penetrate through different regions of the MIM structure 260. The first via portion 275V is a logic contact via that is electrically coupled to the first lower contact feature 253 but electrically insulated from the functional portion of the MIM structure 260. As such the first via portion 275V is electrically insulated from any of the first conductor plate layer 262, the second conductor plate layer 266, and the third conductor plate layer 269. The second via portion 276V electrically couples to sidewalls of the second conductor plate layer 266 but is electrically insulated from the first conductor plate layer 262 and the third conductor plate layer 269. The third via portion 277V electrically couples to the first conductor plate layer 262 and the third conductor plate layer 269 but is electrically insulated from the second conductor plate layer 266. The first via portion 275V is electrically coupled to the first lower contact feature 253. The second via portion 276V is electrically coupled to the second lower contact feature 254. The third via portion 277V is electrically coupled to the third lower contact feature 255.

Figure 13:
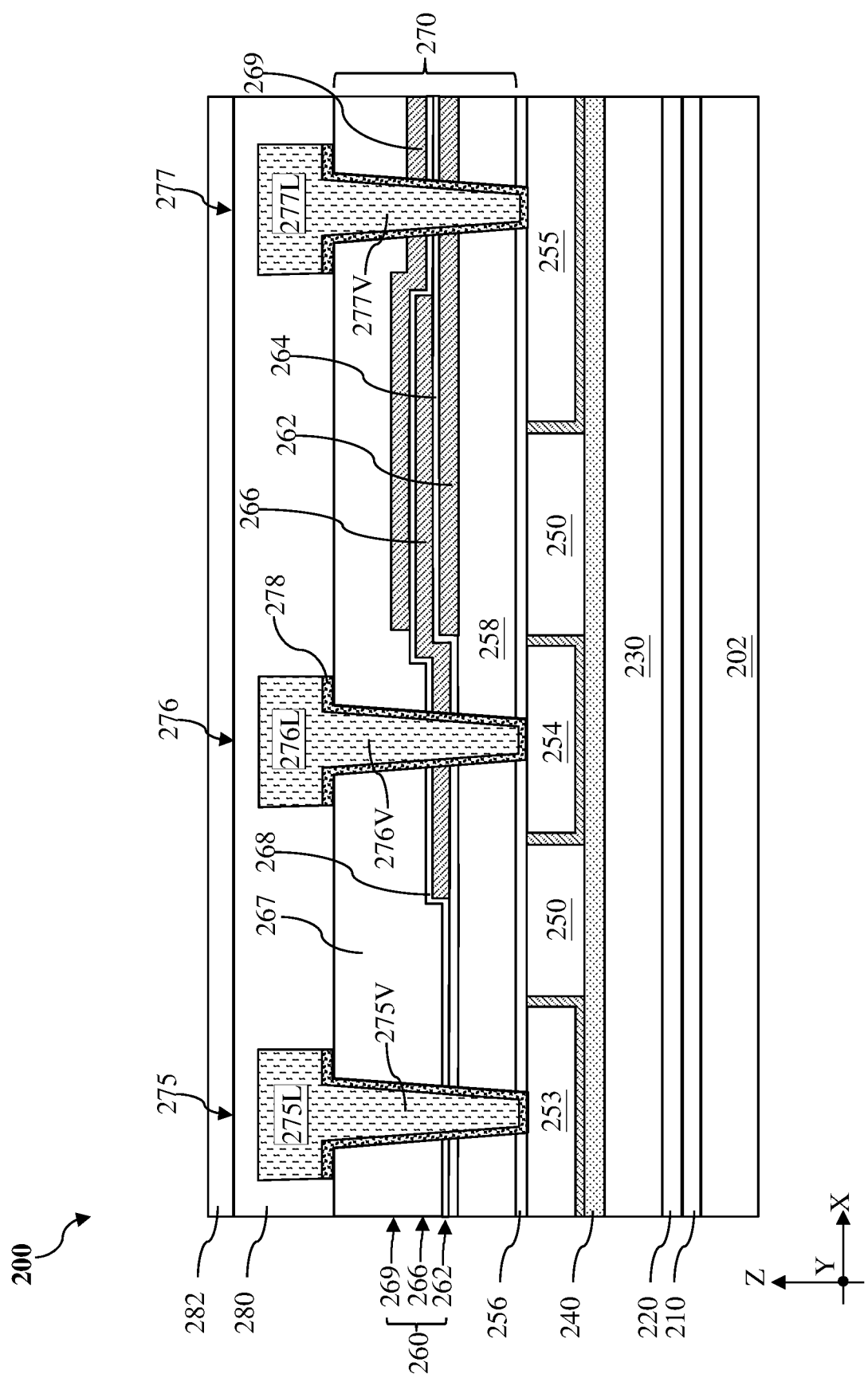

Referring to FIGS. 1 and 13, method 100 includes a block 116 where a passivation structure is formed over upper contact features 275, 276, and 277 and over the fourth dielectric layer 267. As shown in FIG. 13, a first passivation layer 280 is formed over the workpiece 200, including over the line portions 275L, 276L, 277L and the fourth dielectric layer 267. In some embodiments, the first passivation layer 280 may include one or more plasma-enhanced oxide (PEOX) layers, one or more undoped silica glass (USG) layers, or a combination thereof. The first passivation layer 280 may be deposited using CVD, FCVD, spin-on coating, or other suitable technique. In some implementations, the first passivation layer 280 may be formed to a thickness between about 1000 nm and about 1400 nm. A second passivation layer 282 is formed over the first passivation layer 280. In some embodiments, the second passivation layer 282 may include silicon nitride (SiN) and may be formed by CVD, PVD or a suitable method to a thickness between about 600 nm and about 800 nm.

Figure 14:
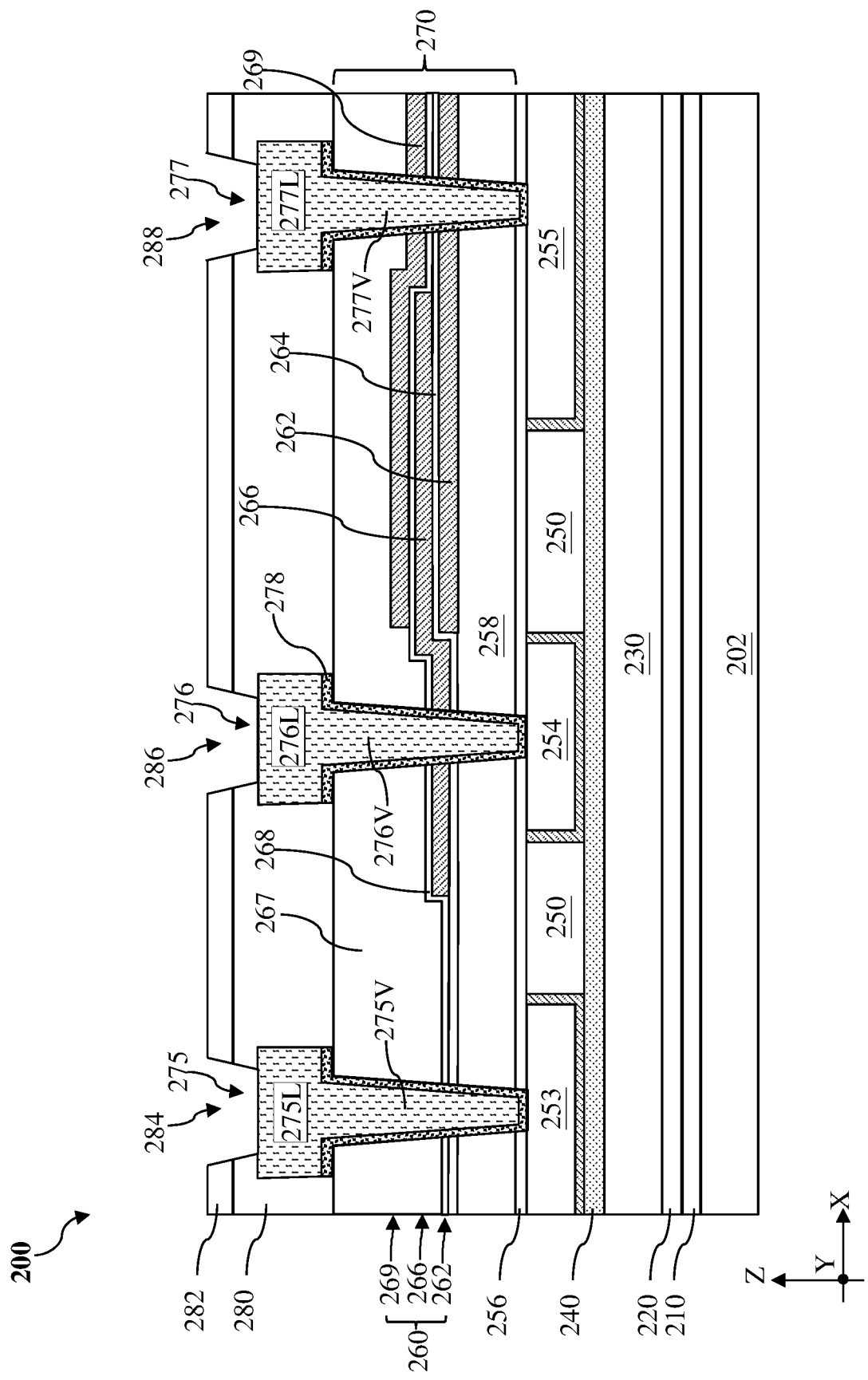

Referring to FIGS. 1 and 14, method 100 includes a block 118 where further processes may be performed. Such further processes may include formation of the openings 284, 286 and 288 through the first passivation layer 280 and the second passivation layer 282 to expose the line portions 275L, 276L and 277L, deposition of one or more polymeric material layers, patterning of the one or more polymeric material layers, deposition of an under-bump-metallurgy (or under-bump-metallization, UBM) layer, deposition of a copper-containing bump layer, deposition of a cap layer, deposition of a solder layer, and reflowing of the solder layer. These further processes form contact structures for connection to external circuitry.

One aspect of the present disclosure involves a method. The method includes depositing a first conductor layer over a substrate, patterning the first conductor layer to form a patterned first conductor layer, depositing a first insulation layer over the patterned first conductor layer, depositing a second conductor layer over the first insulation layer, patterning the second conductor layer to form a patterned second conductor layer, depositing a second insulation layer over the patterned second conductor layer, depositing a third conductor layer over the second insulation layer, and patterning the third conductor layer to form a patterned third conductor layer. The patterning of the first conductor layer includes removing a right-angle corner of the first conductor layer.

In some embodiments, the removing of the right-angle corner includes depositing a hard mask layer over the deposited first conductor layer, depositing a photoresist layer over the hard mask layer, exposing the photoresist layer to a radiation transmitted through a photomask, developing the exposed photoresist layer to form a patterned photoresist layer, etching the hard mask layer using the patterned photoresist layer as an etch mask to form a patterned hard mask layer, and etching the deposited first conductor layer using the patterned hard mask layer as an etch mask. The photomask includes a mask pattern free of right-angle corners. In some implementations, the method further includes after the patterning of the first conductor layer, treating sidewalls of the patterned first conductor layer, after the patterning of the second conductor layer, treating sidewalls of the patterned second conductor layer, and after the patterning of the third conductor layer, treating sidewalls of the patterned third conductor layer. In some embodiments, the treating includes use of nitrous oxide. In some instances, each of the first insulation layer and the second insulation layer includes zirconium oxide or aluminum oxide. In some embodiments, each of the first insulation layer and the second insulation layer includes a first zirconium oxide layer, an aluminum oxide layer over the first zirconium oxide layer, and a second zirconium oxide layer over the aluminum oxide layer.

Another aspect of the present disclosure involves a method. The method includes receiving a workpiece including a first contact feature and a second contact feature embedded in a dielectric layer, depositing a first passivation layer over the first contact feature and the second contact feature, depositing a first conductor layer over the first passivation layer, patterning the first conductor layer to form a patterned first conductor layer, depositing a first insulation layer over the patterned first conductor layer, depositing a second conductor layer over the first insulation layer, patterning the second conductor layer to form a patterned second conductor layer, depositing a second insulation layer over the patterned second conductor layer, depositing a third conductor layer over the second insulation layer, patterning the third conductor layer to form a patterned third conductor layer, forming a first via opening through the second insulation layer, the first insulation layer, and the patterned second conductor layer to expose the second contact feature, and forming a second via opening through the patterned the patterned third conductor layer, the second insulation layer, the first insulation layer, and the patterned first conductor layer to expose the second contact feature. From a top view, none of interior corners and exterior corners of the patterned first conductor layer, the patterned second conductor layer, and the patterned third conductor layer is equal to or smaller than 90 degrees.

In some embodiments, the method further includes after the patterning of the first conductor layer, treating sidewalls of the patterned first conductor layer, after the patterning of the second conductor layer, treating sidewalls of the patterned second conductor layer, and after the patterning of the third conductor layer, treating sidewalls of the patterned third conductor layer. In some implementations, the treating includes use of nitrous oxide. In some instances, each of the first insulation layer and the second insulation layer includes zirconium oxide or aluminum oxide. In some embodiments, each of the first insulation layer and the second insulation layer includes a first zirconium oxide layer, an aluminum oxide layer over the first zirconium oxide layer, and a second zirconium oxide layer over the aluminum oxide layer. In some embodiments, a thickness of the first zirconium oxide layer is equal to a thickness of the second zirconium oxide layer and a thickness of the aluminum oxide layer is equal to the thickness of the first zirconium oxide layer. In some implementations, the method further includes depositing a metal layer over the first via opening and the second via opening, depositing a metal nitride layer over the metal layer, and after the depositing the metal nitride layer, depositing a metal alloy into the first via opening and the second via opening. In some instances, the metal layer includes tantalum, the metal nitride layer includes tantalum nitride, and the metal alloy includes aluminum and copper.

Still another aspect of the present disclosure involves a device structure. The device structure includes a first conductor layer over a substrate, a first insulation layer over the first conductor layer, a second conductor layer over the first insulation layer, a second insulation layer over the second conductor layer, and a third conductor layer over the second insulation layer. From a top view, none of interior corners and exterior corners of the first conductor layer, the second conductor layer, and the third conductor layer is equal to or smaller than 90 degrees.

In some embodiments, the first conductor layer and the second conductor layer include titanium nitride. In some implementations, each of the first insulation layer and the second insulation layer includes zirconium oxide or aluminum oxide. In some instances, each of the first insulation layer and the second insulation layer includes a first zirconium oxide layer, an aluminum oxide layer over the first zirconium oxide layer, and a second zirconium oxide layer over the aluminum oxide layer. In some embodiments, a thickness of the first zirconium oxide layer is equal to a thickness of the second zirconium oxide layer and a thickness of the aluminum oxide layer is equal to the thickness of the first zirconium oxide layer. In some instances, from the top view, the interior corners and exterior corners of the first conductor layer, the second conductor layer, and the third conductor layer include a 135-degree angle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
depositing a first conductor layer over a substrate;
patterning the first conductor layer to form a patterned first conductor layer;
depositing a first insulation layer over the patterned first conductor layer;
depositing a second conductor layer over the first insulation layer;
patterning the second conductor layer to form a patterned second conductor layer;
depositing a second insulation layer over the patterned second conductor layer;
depositing a third conductor layer over the second insulation layer; and
patterning the third conductor layer to form a patterned third conductor layer,
wherein the patterning of the first conductor layer comprises removing a right-angle corner of the first conductor layer,
wherein the removing of the right-angle corner comprises:
depositing a hard mask layer over the deposited first conductor layer,
depositing a photoresist layer over the hard mask layer,
exposing the photoresist layer to a radiation transmitted through a photomask,
developing the exposed photoresist layer to form a patterned photoresist layer,
etching the hard mask layer using the patterned photoresist layer as an etch mask to form a patterned hard mask layer, and
etching the deposited first conductor layer using the patterned hard mask layer as an etch mask,
wherein the photomask comprises a mask pattern free of right-angle corners.

2. The method of claim 1, further comprising:
after the patterning of the first conductor layer, treating sidewalls of the patterned first conductor layer;
after the patterning of the second conductor layer, treating sidewalls of the patterned second conductor layer; and after the patterning of the third conductor layer, treating sidewalls of the patterned third conductor layer.

3. The method of claim 2, wherein the treating comprises use of nitrous oxide.

4. The method of claim 1, wherein each of the first insulation layer and the second insulation layer comprises zirconium oxide or aluminum oxide.

5. The method of claim 1, wherein each of the first insulation layer and the second insulation layer comprises a first zirconium oxide layer, an aluminum oxide layer over the first zirconium oxide layer, and a second zirconium oxide layer over the aluminum oxide layer.

6. The method of claim 1, further comprising:
forming a first via opening through the second insulation layer, the first insulation layer, and the patterned second conductor layer; and
forming a second via opening through the patterned third conductor layer, the second insulation layer, the first insulation layer, and the patterned first conductor layer.

7. A method, comprising:
receiving a workpiece including a first contact feature and a second contact feature embedded in a dielectric layer;
depositing a first passivation layer over the first contact feature and the second contact feature;
depositing a first conductor layer over the first passivation layer;
patterning the first conductor layer to form a patterned first conductor layer;
depositing a first insulation layer over the patterned first conductor layer;
depositing a second conductor layer over the first insulation layer;
patterning the second conductor layer to form a patterned second conductor layer;
depositing a second insulation layer over the patterned second conductor layer;
depositing a third conductor layer over the second insulation layer;
patterning the third conductor layer to form a patterned third conductor layer;
forming a first via opening through the second insulation layer, the first insulation layer, and the patterned second conductor layer to expose the first contact feature; and
forming a second via opening through the patterned third conductor layer, the second insulation layer, the first insulation layer, and the patterned first conductor layer to expose the second contact feature,
wherein, from a top view, none of interior corners and exterior corners of the patterned first conductor layer, the patterned second conductor layer, and the patterned third conductor layer is equal to or smaller than 90 degrees.

8. The method of claim 7, further comprising:
after the patterning of the first conductor layer, treating sidewalls of the patterned first conductor layer;
after the patterning of the second conductor layer, treating sidewalls of the patterned second conductor layer; and
after the patterning of the third conductor layer, treating sidewalls of the patterned third conductor layer.

9. The method of claim 8, wherein the treating comprises use of nitrous oxide.

10. The method of claim 8, wherein each of the first insulation layer and the second insulation layer comprises zirconium oxide or aluminum oxide.

11. The method of claim 8, wherein each of the first insulation layer and the second insulation layer comprises a first zirconium oxide layer, an aluminum oxide layer over the first zirconium oxide layer, and a second zirconium oxide layer over the aluminum oxide layer.

12. The method of claim 11,
wherein a thickness of the first zirconium oxide layer is equal to a thickness of the second zirconium oxide layer,
wherein a thickness of the aluminum oxide layer is equal to the thickness of the first zirconium oxide layer.

13. The method of claim 7, further comprising:
depositing a metal layer over the first via opening and the second via opening;
depositing a metal nitride layer over the metal layer; and
after the depositing the metal nitride layer, depositing a metal alloy into the first via opening and the second via opening.

14. The method of claim 13,
wherein the metal layer comprises tantalum,
wherein the metal nitride layer comprises tantalum nitride,
wherein the metal alloy comprises aluminum and copper.

15. A method, comprising:
receiving a first mask design and a second mask design;
modifying the first mask design and the second mask design such that the modified first mask design and the modified second mask design are free of right-angled corners;
producing a first photomask using the modified first mask design;
producing a second photomask using the modified second mask design;
depositing a first conductor layer over a first passivation layer;
patterning the first conductor layer using the first photomask to form a patterned first conductor layer;
depositing a first insulation layer over the patterned first conductor layer;
depositing a second conductor layer over the first insulation layer;
patterning the second conductor layer using the second photomask to form a patterned second conductor layer;
depositing a second insulation layer over the patterned second conductor layer;
depositing a third conductor layer over the second insulation layer; and
patterning the third conductor layer to form a patterned third conductor layer,
wherein the first mask design and the second mask design comprise interior right-angle corners and exterior right-angle corners,
wherein the modifying the first mask design and the second mask design comprises cutting the interior right-angle corners and filling the exterior right-angle corners.

16. The method of claim 15, further comprising:
after the patterning of the first conductor layer, treating sidewalls of the patterned first conductor layer;
after the patterning of the second conductor layer, treating sidewalls of the patterned second conductor layer; and
after the patterning of the third conductor layer, treating sidewalls of the patterned third conductor layer.

17. The method of claim 16, wherein the treating comprises use of nitrous oxide.

18. The method of claim 15, wherein each of the first insulation layer and the second insulation layer comprises zirconium oxide or aluminum oxide.

19. The method of claim 15, wherein each of the first insulation layer and the second insulation layer comprises a first zirconium oxide layer, an aluminum oxide layer over the first zirconium oxide layer, and a second zirconium oxide layer over the aluminum oxide layer.

20. The method of claim 19,
wherein a thickness of the first zirconium oxide layer is equal to a thickness of the second zirconium oxide layer,
wherein a thickness of the aluminum oxide layer is equal to the thickness of the first zirconium oxide layer.

* * * * *